(12) United States Patent
Whitney et al.

(10) Patent No.: US 10,083,890 B2
(45) Date of Patent: Sep. 25, 2018

(54) BORON NITRIDE NANOTUBE ENHANCED ELECTRICAL COMPONENTS

(71) Applicant: BNNT, LLC, Newport News, VA (US)

(72) Inventors: R. Roy Whitney, Newport News, VA (US); Kevin C. Jordan, Newport News, VA (US); Michael W. Smith, Newport News, VA (US); Jonathan C. Stevens, Williamsburg, VA (US)

(73) Assignee: BNNT, LLC, Newport News, VA (US)

( * ) Notice: Subject to any disclaimer, the term of this patent is extended or adjusted under 35 U.S.C. 154(b) by 0 days.

(21) Appl. No.: 15/540,539

(22) PCT Filed: Dec. 17, 2015

(86) PCT No.: PCT/US2015/066464
§ 371 (c)(1),
(2) Date: Jun. 28, 2017

(87) PCT Pub. No.: WO2016/100715
PCT Pub. Date: Jun. 23, 2016

(65) Prior Publication Data
US 2017/0352606 A1    Dec. 7, 2017

Related U.S. Application Data

(60) Provisional application No. 62/185,329, filed on Jun. 26, 2015, provisional application No. 62/180,353, (Continued)

(51) Int. Cl.
*H01L 23/58*    (2006.01)
*H01L 23/373*    (2006.01)
(Continued)

(52) U.S. Cl.
CPC ...... *H01L 23/3733* (2013.01); *C01B 21/0648* (2013.01); *C09K 5/14* (2013.01);
(Continued)

(58) Field of Classification Search
CPC ... H01L 23/3733; C01B 21/0648; C09K 5/14; B82Y 30/00; B82Y 40/00;
(Continued)

(56) References Cited

U.S. PATENT DOCUMENTS

| 3,216,942 A | 11/1965 | Wentorf |
| 3,352,637 A | 11/1967 | Heymer |

(Continued)

FOREIGN PATENT DOCUMENTS

| KR | 2011-0113201 | 10/2011 |
| WO | WO 2009017526 | 2/2009 |

(Continued)

OTHER PUBLICATIONS

Smith, et al., Very Long Single and Few-walled Boron Nitride Nanotubes via the Pressurized Vapor/Condenser Method, Nanotechnology, 2009.

(Continued)

*Primary Examiner* — Tu-Tu Ho
(74) *Attorney, Agent, or Firm* — Joshua B. Brady; Williams Mullen

(57) ABSTRACT

Aligned high quality boron nitride nanotubes (BNNTs) can be incorporated into groups and bundles and placed in electronic and electrical components (ECs) to enhance the heat removal and diminish the heat production. High quality BNNTs are excellent conductors of heat at the nano scale. High quality BNNTs are electrically insulating and can reduce dielectric heating. The BNNTs composite well with a broad range of ceramics, metals, polymers, epoxies and thermal greases thereby providing great flexibility in the design of ECs with improved thermal management. Controlling the alignment of the BNNTs both with respect to each other and the surfaces and layers of the ECs provides the preferred embodiments for ECs.

39 Claims, 15 Drawing Sheets

Related U.S. Application Data filed on Jun. 16, 2015, provisional application No. 62/153,155, filed on Apr. 27, 2015, provisional application No. 62/092,906, filed on Dec. 17, 2014.

(51) Int. Cl.
| | | |
|---|---|---|
| *C01B 21/064* | (2006.01) | |
| *C09K 5/14* | (2006.01) | |
| *B82Y 30/00* | (2011.01) | |
| *B82Y 40/00* | (2011.01) | |

(52) U.S. Cl.
CPC .............. *B82Y 30/00* (2013.01); *B82Y 40/00* (2013.01); *C01P 2004/13* (2013.01); *C01P 2006/32* (2013.01); *Y10S 977/734* (2013.01); *Y10S 977/892* (2013.01); *Y10S 977/932* (2013.01)

(58) Field of Classification Search
CPC .............. C01P 2004/13; C01P 2006/32; Y10S 977/734; Y10S 977/892; Y10S 977/932
USPC ........................................................ 257/629
See application file for complete search history.

(56) References Cited

U.S. PATENT DOCUMENTS

| | | | |
|---|---|---|---|
| 5,305,612 | A | 4/1994 | Higham |
| 5,932,294 | A | 8/1999 | Colombo |
| 7,335,890 | B2 | 2/2008 | Utterback |
| 7,582,880 | B2 | 9/2009 | Wallace |
| 7,927,525 | B2 | 4/2011 | Lizotte |
| 8,206,674 | B2 | 6/2012 | Smith |
| 8,309,242 | B2 | 11/2012 | Wei |
| 8,673,120 | B2 | 3/2014 | Whitney et al. |
| 8,703,023 | B2 | 4/2014 | Sainsbury |
| 2002/0113335 | A1 | 8/2002 | Lobovsky |
| 2005/0116336 | A1 | 6/2005 | Chopra |
| 2005/0118090 | A1 | 6/2005 | Shaffer |
| 2005/0155358 | A1 | 7/2005 | Ash |
| 2005/0237442 | A1 | 10/2005 | Yamazaki |
| 2006/0173397 | A1 | 8/2006 | Tu |
| 2007/0004225 | A1 | 1/2007 | Lu |
| 2008/0138577 | A1 | 6/2008 | Sheehan |
| 2008/0150165 | A1* | 6/2008 | Stumbo ................. B23K 26/073 257/784 |
| 2008/0187657 | A1 | 8/2008 | Altan |
| 2008/0191395 | A1 | 8/2008 | Johnson |
| 2008/0296559 | A1 | 12/2008 | Kreupl |
| 2009/0117021 | A1 | 5/2009 | Smith |
| 2010/0108276 | A1 | 5/2010 | Kuwahara |
| 2010/0192535 | A1 | 8/2010 | Smith |
| 2011/0104534 | A1 | 5/2011 | Wei |
| 2011/0140318 | A1 | 6/2011 | Reeves |
| 2011/0143915 | A1 | 6/2011 | Yin |
| 2011/0212308 | A1 | 9/2011 | Brown |
| 2012/0045688 | A1 | 2/2012 | Liu |
| 2012/0168299 | A1 | 7/2012 | Whitney |
| 2012/0199747 | A1 | 8/2012 | Letant |
| 2012/0321785 | A1* | 12/2012 | Rogers ................... B82Y 10/00 427/249.1 |
| 2013/0064750 | A1 | 3/2013 | Zettl |
| 2013/0099264 | A1 | 4/2013 | Zimmerman |
| 2013/0144576 | A1 | 6/2013 | Gnoffo et al. |
| 2014/0364529 | A1 | 12/2014 | Park et al. |
| 2015/0033937 | A1 | 2/2015 | Lashmore |
| 2015/0125374 | A1 | 5/2015 | Smith et al. |
| 2016/0144401 | A1* | 5/2016 | Carter ................. H01L 51/0012 428/179 |

FOREIGN PATENT DOCUMENTS

| | | |
|---|---|---|
| WO | WO 2012096775 | 7/2012 |
| WO | WO 2012108941 | 8/2012 |
| WO | WO 2013082117 | 6/2013 |
| WO | WO 2014169382 | 10/2014 |
| WO | WO 2015164777 | 10/2015 |

OTHER PUBLICATIONS

Wang, et al., Recent Advancements in Boron Nitride Nanotubes, Nanoscale, 2010, 2, 2028-2034.
K.S. Kim, C.T. Kingston, A. Hrdina, M.B. Jakubinek, J. Guan, M. Plunkett and B. Simcard, ACS Nano, 2014, 8, 6211.
A. Fathalizadeh, T. Pham, W. Mickelson and A. Zetti, Nano Lett., 2014, 14, 4881.
International Search Report and Written Opinion for PCT/US2014/063349, USPTO, dated Feb. 15, 2015.
International Search Report and Written Opinion for PCT/US2015/027570, USPTO, dated Aug. 7, 2015.
International Search Report and Written Opinion for PCT/US2015/058615, USPTO, dated Jan. 19, 2016.
Su et al., Selective Growth of Boron Nitride Nanotubes by Plasma-Assisted and Iron-Catalytic CVD Methods, J. Phys. Chem., Jul. 22, 2009, 113, pp. 14681-14688. (cited in Feb. 15, 2015 Written Opinion for PCT/US2014/63349).
Mukhanov, et al., On Electrical Conductivity of Melts of Boron and Its Compounds Under Pressure, Journal of Superhard Materials, vol. 37, No. 4, 2015, pp. 289-291.
International Search Report and Written Opinion for PCT/US2016/023432 dated May 26, 2016.
International Search Report and Written Opinion for PCT/US2015/066464 dated Apr. 11, 2016.
International Search Report and Written Opinion for PCT/US2016/032385 dated Aug. 26, 2016.
Korean Preliminary Office Action dated Mar. 7, 2017 in KR Application No. 10-2016-7031895 with English language translation of the same.
Extended European Search Report dated Feb. 2, 2017 in EP Application No. 15783501.8.
Canadian Office Action dated Nov. 17, 2016 in CA Application No. 2945977.
Australian Examiner's First Patent Examination Report dated Oct. 25, 2016 in Australian Patent Application No. 2015249316.
Hanafin, et al., Boron Fiber Neutron Shielding Properties, Specialty Materials, 2011 (Retrieved on Jul. 14, 2016) from Internet URL <http://www.specmaterials.com/pdfs/boronneutronshielding.pdf> p. 1.
Yu, et al., Dispersion of boron nitride nanotubes in aqueous solution with the help of ionic surfactants. Solid State Communications 149 (2009) 763-766. (Retrieved Jul. 14, 2016 from internet URL <http://dro.deakin.edu.au/view/ DU:30029180> pp. 763-766.
Nishiwaki et al., Atomic structures and formation mechanism of boron nitride nanotubes and nanohorns synthesized by arc-melting $LaB_6$ powders; J. of the European Ceramic Society 26 (2006) 435-441.

\* cited by examiner

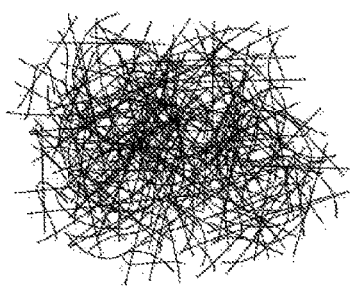
Fig. 2A
Fig. 2B
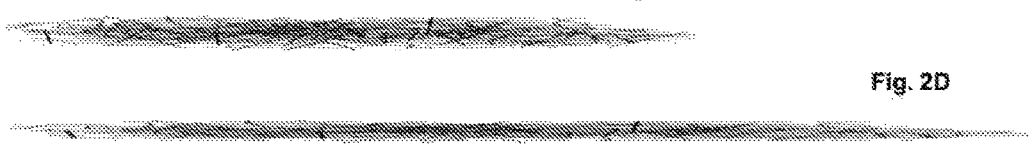
Fig. 2C
Fig. 2D

BORON NITRIDE NANOTUBE ENHANCED ELECTRICAL COMPONENTS

CROSS-REFERENCE TO RELATED APPLICATIONS

This application claims benefit to U.S. Provisional Patent Application No. 62/092,906, filed Dec. 17, 2014; U.S. Provisional Patent Application No. 62/153,155, filed Apr. 27, 2015; U.S. Provisional Patent Application No. 62/180,353 filed Jun. 16, 2015; and U.S. Provisional Patent Application No. 62/185,329 filed Jun. 26, 2015; and is related to International Patent Application No. PCT/US15/27570, filed Apr. 24, 2015. The contents of these applications are expressly incorporated by reference.

STATEMENT REGARDING GOVERNMENT SUPPORT

None.

FIELD

The present disclosure generally relates to enhancing the performance of electrical components through the inclusion of boron nitride nanotubes.

BACKGROUND

As electronic and electrical components (ECs), such as diodes, light emitting diodes (LEDs), transistors, integrated circuits and multilayer integrated circuits, become more prevalent devices, EC performance becomes more critical. In most instances, EC performance is frequently limited by the EC's ability to minimize heat production and improver heat transport away from the heat generating regions to heat sinks, thereby keeping the junction temperatures and component temperatures low and diminishing thermally-generated mechanical stresses in the materials and layers making up the EC.

The diodes, transistors, etc. in ECs all have a certain amount of electrical resistance. When electrical currents flow in the ECs, heat is generated. One parameter of importance is the junction temperature, where one type of semiconductor interfaces with another type of semiconductor. This is also the location where much of the resistance is located. Heat generated at these locations impacts the performance including lifetime of the EC. Removing this heat and keeping the junction temperatures as low as possible is important for proper functioning of the EC.

Carbon nanotubes (CNTs), graphene and pyrolytic graphite can be incorporated in ECs where electrically conductive and/or semi conductive properties are desired. CNTs and graphene can also favorably affect heat transport and structural strength. However, they do not work where the material needs to be electrically insulating. Thus, CNTs have limited efficacy with respect to enhancing ECs.

Boron nitride nanotubes (BNNTs) have been considered for a number of prospective applications, such as, for example: enhancing the strength of ceramic, metal and polymer composites, functionalizing with other attached molecules for a range of chemical reactions, enhancing the thermal conductivity of certain composites, creating filters and associated mats, neutron detectors, biomedical interactions including electroporation for cancer treatment, piezoelectric devices, and electrically insulating layers in supercapacitors (also known as ultracapacitors).

High quality BNNTs, such as those manufactured by BNNT, LLC of Newport News, Va., have few defects, no catalyst impurities, 1- to 10-walls with the peak in the distribution at 2-walls and rapidly decreasing with larger number of walls. Although dimensions may vary depending on the manufacturing process, BNNT diameters typically range from 1.5 to 6 nm but may extend beyond this range, and lengths typically range from a few hundreds of nm to hundreds of microns but may extend beyond this range.

Previous patents and published applications have suggested the addition of materials including BNNTs into the materials going into ECs. See for example: U.S. Patent Publication US2014/0080954 A1 to Raman et al.; and U.S. Pat. No. 6,864,571 B2 to Arik et al. However, the methods disclosed Raman merely suggest use of BNNTs in bulk, and the methods disclosed by Arik merely suggest "generally aligned nanotubes that extend away from the catalyst layer" i.e. in the out-of-plane and similar out-of-plane heat transfer for limited aspects of the ECs. Merely dispersing or including the BNNTs into the materials going into ECs or out-of-plane thermal conductivity is insufficient to enhance the thermal management in ECs. The chemical vapor deposition (CVD) growth methods of Arik do not produce high quality BNNTs, i.e. few wall, high aspect ratio, minimal defects and catalyst free, as they take place at temperatures and nitrogen pressures far below what is required for high quality BNNTs. Indeed, Arik's use of chemical vapor deposition to form BNNTs severely limits Arik's ability to enhance ECs using BNNT group layers. What is needed are more effective methods for enhancing thermal management in ECs.

BRIEF SUMMARY

This disclosure relates to leveraging the unique properties of BNNTs by incorporating them in electronic and electrical components (ECs for both electronic and electrical components). The resultant ECs are enhanced by having improved heat management, improved dielectric properties, enhanced ionic transport and enhanced strength. For most of the incorporation of the BNNTs in electronic and electrical components, the improved or enhanced performance includes having BNNTs that are aligned or partially aligned. This is important as stated in the Background above because alignment greatly enhances the thermal conductivity and further provide desirable dielectric and structural properties. Further, these properties can be directional; for example the alignment can create thermal direction "pipes" for transporting the heat in preferred directions.

The heat conductivity of groups of BNNTs is greatly enhanced when the BNNTs are aligned relative close to each other along their lengths such that phonons can couple from one BNNT to another. Also important for enhancing BNNT thermal conductivity is having very long BNNTs with few walls and few defects such that phonons have a considerable length to propagate and opportunity to couple phonons to other BNNTs or other materials that the BNNTs have been composited with or coated with in the case of layered composites. Depending on the manufacturing process, high quality BNNTs may have impurities of boron, amorphous BN and h-BN, all of which are also electrical insulating materials.

The pattern of the BNNTs in the materials is important to achieve optimal performance. In many instances having directionality of the heat flow is desirable and BNNTs as described herein provide this directionality. In other cases uniform heat flow in all directions is desirable. The optimum configuration is EC-specific, and thus may vary in different embodiments. Further, the electronic properties of the EC, such as the dielectric value, can be enhanced by the appropriate alignment of the BNNTs.

A method for thermal management in an electrical component may include applying a BNNT group layer to a contact surface of a material layer in the electrical component, such that the BNNT group layer is aligned generally parallel to the contact surface, such that the BNNTs in the BNNT group layer are generally parallel to the contact surface. In some embodiments, the BNNT group layer may be linearly aligned, such that the BNNTs are also generally parallel to each other. It should be appreciated that "generally parallel" includes embodiments in which the long axis for the majority of BNNTs in a BNNT group are oriented less than 90-degrees relative to the contact surface. In practice, there are variabilities in the orientation of BNNTs in a BNNT group. For example, a majority of BNNTs may be oriented at less than 90-degrees relative to the surface, a smaller fraction oriented at less than about 45-degrees relative to the surface, and an even smaller fraction oriented at less than about 15-degrees relative to the surface. Preferably, the long axis for the majority of the BNNTs are nearly parallel to the contact surface. In practice, however, BNNTs have non-linear portions, and thus this specification references "generally parallel" to account for non-linear portions as well as the variability of BNNTs within a BNNT group. The contact surface may include a source and a drain, such as in the case of a diode. In some embodiments, the EC may be a transistor, and the contact surface may include a source, a gate, and a drain. In some embodiments the BNNT group layer may out-of-plan to the layers of the EC such as to provide a layer-to-layer thermal interconnect. Of course, an EC such as a transistor or a diode may have other material layers in contact with a BNNT group layer. The alignment may be linear, such that the BNNTs are generally parallel to each other. Alternatively, the alignment may be two-dimensional or 2-D. The BNNT group layer may be, for example, a BNNT mat or a BNNT bundle such as BNNT fibers and woven BNNT yarns. ECs may be fabricated to have one or more of these features.

A variety of techniques may be used to align the BNNT group layer. For example, the layer may be aligned through flattening and/or stretching processes. The BNNTs may also be aligned in the BNNT synthesis or manufacturing process, as in the formation of BNNT fibers and yarns, or as another example in the formation of a BNNT mat.

In some embodiments, the BNNT group layer may include one or more compositing materials. The compositing material(s) may be composited in bulk, e.g., generally uniform throughout the BNNT group layer. In some embodiments, the compositing material(s) may be site-specific, e.g., present at specific portions of the BNNT group layer, such as at certain locations along the length of a BNNT bundle. Depending on the embodiment, the compositing material may be, for instance, a ceramic, a metal, a polymer, an epoxy, and/or a thermal grease. Some embodiments may include a compositing material infused in the BNNT group layer. The BNNT group layer may be composited with an electrical conductor in some embodiments. In some embodiments the BNNT fibers may be first coated with one material and then that coated BNNT fibers are composited with a third material.

The EC may include a BNNT group layer compressed into the material layer. Some ECs, such as integrated circuits, may include multiple layers. In such embodiments, one or more BNNT group layers may be sandwiched between material layers in the EC. In some embodiments, a portion of the BNNTs in the BNNT group layer penetrate the contract surface, such that the BNNT group layer is embedded in the contact surface. Some embodiments may leave terminal ends of the BNNT group layer exposed to the environment, e.g., such that the ends of some of the BNNTs may transfer heat directly to the environment (e.g., air or another medium). In some embodiments, the terminal end may be present in a compositing material, such that the BNNTs transfer heat to the compositing material.

DRAWINGS

FIG. 2 illustrates how the randomly aligned BNNT molecules or fibers become aligned when flattened or stretched.

DESCRIPTION

Figure 1:
FIG. 1 shows as produced high quality BNNT material and has the appearance of a "cotton ball."

The following description is of the best currently contemplated mode of carrying out exemplary embodiments of the present approach. The description is not to be taken in a limiting sense, and is made merely for the purpose of illustrating the general principles of the present approach.

BNNTs may be present in an EC in a group, e.g., several nanotubes forming a layer. The BNNTs in a group may be in various forms, such as, for example, fibers, strands, a mat, or yarn. The alignment of a plurality of BNNTs will impact the heat conductivity of the BNNT group. The heat conductivity of BNNT groups is greatly enhanced when the BNNTs are aligned relative close to each other along their lengths, i.e., the long axis of each tube generally runs in the same direction. Additionally, BNNT thermal conductivity may be enhanced through using long BNNTs, e.g., with lengths more than 1,000 times the nanotube diameter, and preferably more than 10,000 times the diameters, with few walls, e.g.

1-10, and preferably with a peak in the 2- and 3-wall range, and few defects, such that phonons may propagate along the long axis of the nanotubes. In some embodiments isotopically pure boron may be used, i.e. $^{10}$B or $^{11}$B, as the phonon propagation is further enhanced with very pure BNNT material. Very long BNNTs also provide the opportunity for phonons to couple to other BNNTs, or other materials in an EC composited with or coated to the BNNTs. Aligned BNNTs can be produced using various techniques, including, for example, by certain synthesis processes, stretching and compressing processes, and/or by performing purification and alignment processes on what may be otherwise unaligned or minimally aligned BNNTs. These techniques may be used independently or in combination.

High quality BNNTs generally have few defects, no catalyst impurities, 1- to 10-walls with the peak in the distribution at 2-walls and rapidly decreasing with larger number of walls. BNNT, LLC, of Newport News, Va., produces high quality BNNTs with these parameters, among others. BNNT diameters typically range from 1.5 to 6 nm but may extend beyond this range, and lengths typically range from a few hundreds of nm to hundreds of microns but may extend beyond this range. Depending on the manufacturing process, high quality BNNTs may have impurities of boron, amorphous BN and h-BN, all of which are also electrical insulating materials. In some instances minimizing the amounts of impurities is beneficial as the amount of BNNT nanotube to nanotube interaction is increased with less impurities.

Important properties of BNNT include: thermal stability in air to over 900 C, thermal stability in most materials to even higher temperatures, strength similar to carbon nanotubes (CNTs), strength maintenance at temperatures over 900 C and temperatures below −269 C. Also, BNNTs are an electrical insulator with approximately a 6 eV band gap, have minimal chemical reactions with most materials, composite well with most ceramics, metals and polymers, and have high thermal conductivity.

Pyrolytic boron nitride can be incorporated in ECs where electrically insulating layers are desired. However, they thickness of pyrolytic boron nitride sheets or coatings are typically too thick to provide the close surface connection to the subcomponents that make up ECs to provide the desired level of enhanced performance.

Hexagonal boron nitride (h-BN) sheets and flakes similar to graphene can provide some enhanced thermal management for some ECs due to the thermal conductivity of the h-BN and in some instances the dielectric properties of the h-BN. However, the tubular nature of high quality BNNT with their usually hollow centers provide preferred enhancements in most embodiments.

The pattern of the BNNTs in the materials in an EC is important to achieve optimal thermal management performance. In many instances having directionality of the heat flow is desirable. BNNTs as described herein provide this directionality. In other cases uniform heat flow in all directions is desirable. Thus, the optimum configuration is EC-specific. Some embodiments may feature multiple configurations. Further, the electronic properties of the EC, such as the dielectric value, can be enhanced by the appropriate alignment of the BNNTs.

FIG. 1 is a photograph of "as produced" high quality BNNTs available in bulk from BNNT, LLC. The BNNTs in this photograph were produced using a high temperature, high pressure synthesis process, and have the appearance of a cotton ball with a tap density of approximately 0.5-1 gram/liter. FIG. 2 demonstrates how a combination of stretching and flattening processes may be used to manipulate the alignment of BNNTs shown in FIG. 1. FIG. 2 illustrates randomly aligned BNNT fibers 21, as may be present in a BNNT ball such as shown in FIG. 1. The alignment of BNNT fibers 21 illustrated in FIG. 2 progressively increases through compression and/or stretching, as illustrated in FIG. 2. It should be appreciated that a variety of mechanical processes may be used to perform compression and/or stretching on BNNTs 21. Flattening processes enhance the 2-D alignment for a BNNT group, while stretching and flattening processes enhance the 1-D or linear alignment of a BNNT group.

Figure 3:
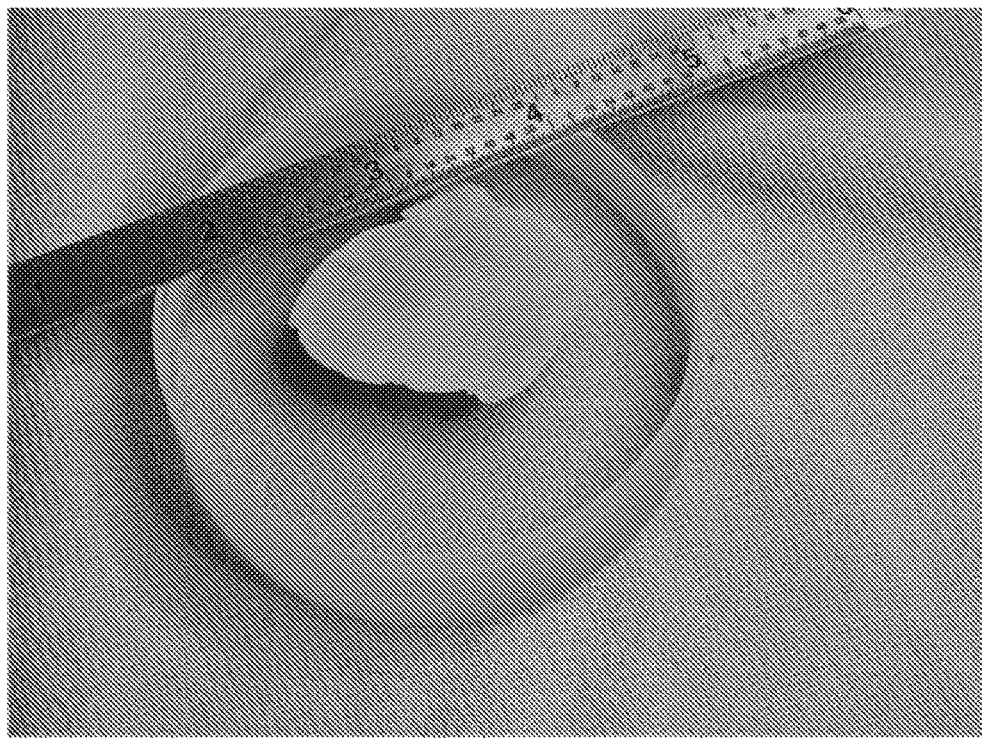
FIG. 3 shows a BNNT cotton ball compressed into a mat thereby creating alignment of the BNNT fibers.

FIG. 3 shows an example of stretched and compressed BNNT from stretching and compressing a BNNT ball. A BNNT ball manufactured by BNNT, LLC, was mechanically compressed between two glass cylinders. The density of the material increased by over a factor of 100.

Figure 4:
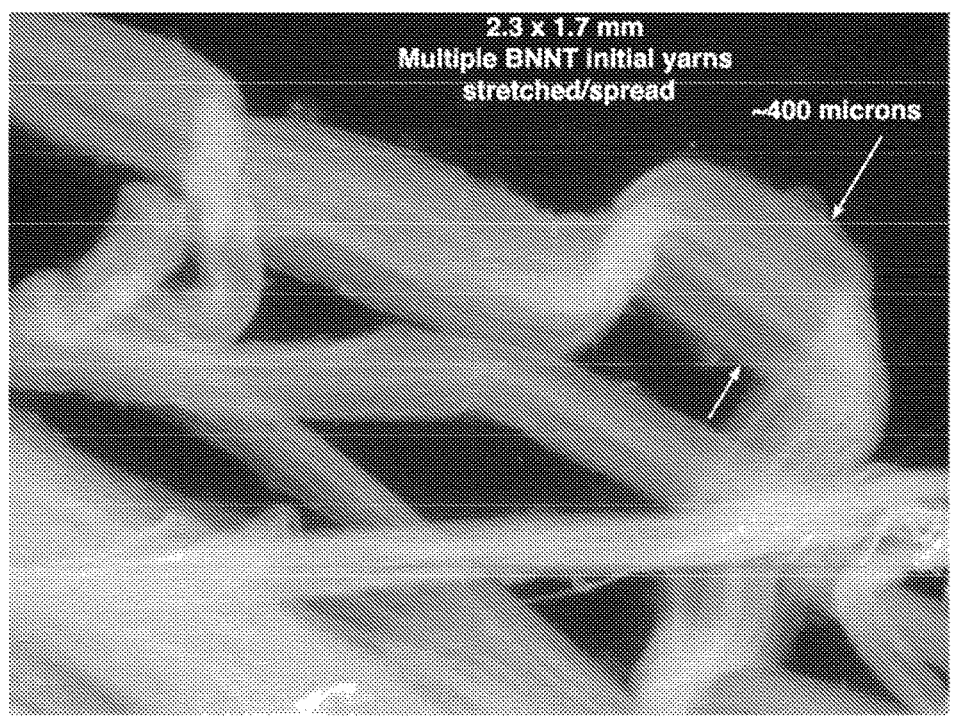
FIG. 4 shows BNNT fibers synthesized in one of the high quality BNNT synthesis processes where BNNT initial yarns or strands have been created.

The BNNT manufacturing process also provides alternative methods for producing aligned BNNTs, and in particular linearly-aligned BNNTs. FIG. 4 shows a BNNT initial yarn produced by a synthesis process and the BNNT fibers are partially aligned as part of the synthesis process. International application no. PCT/US15/027570, which is incorporated by reference in its entirety, describes processes for manufacturing BNNT fibers and yarns. These processes are sometimes referred to as dry spinning. In dry spinning processes, the BNNTs naturally align due to Van der Waals forces and pull together for further alignment. BNNT initial yarns can be infused with compositing material and stretched to further enhance the alignment and provide a distribution mechanism useful in some embodiments.

Figure 5:
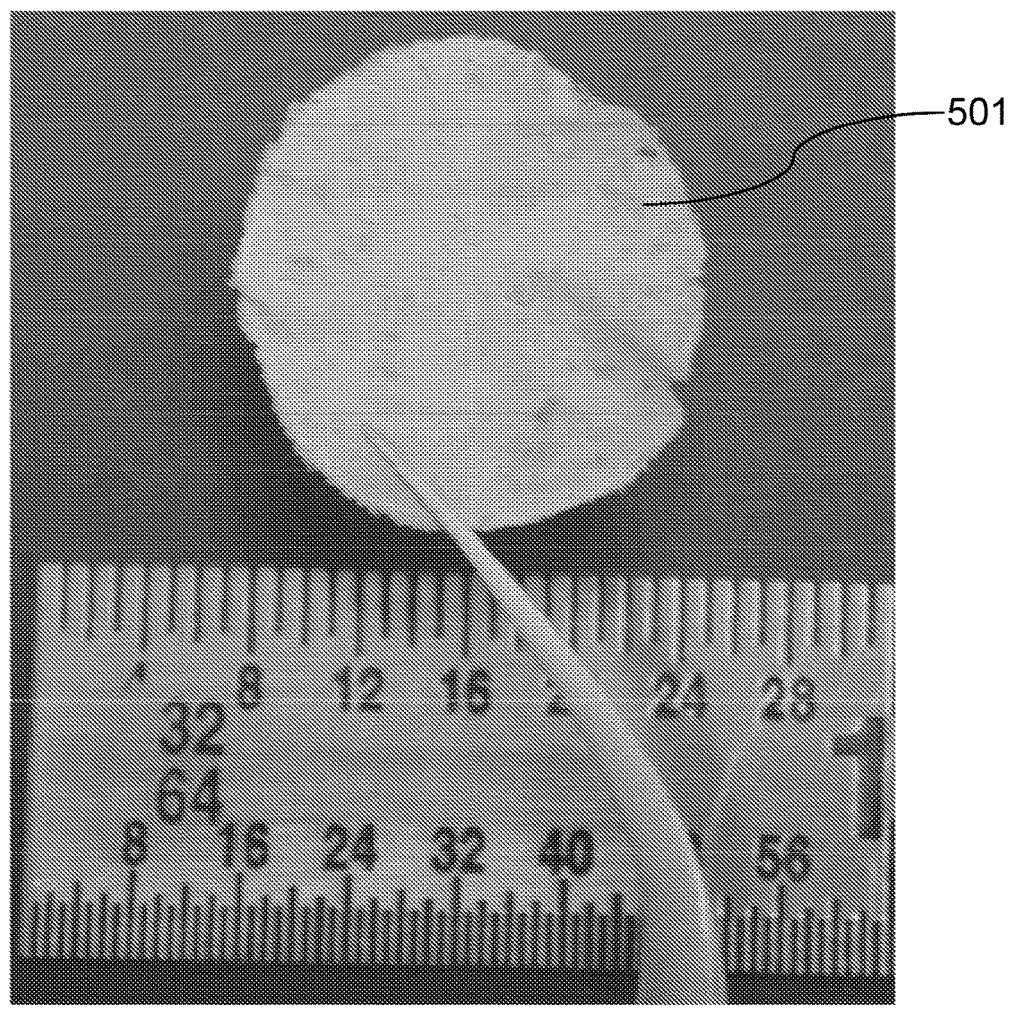
FIG. 5 shows a BNNT mat made from a filtration process.

In some embodiments, BNNT groups such as a BNNT mat may be formed through dispersing and filtration processes. BNNTs may be dispersed in a fluid dispersant, such as water with a surfactant, alcohol, toluene, and the like, and then pulled through a filter. A variety of dispersants may be used, and this disclosure is not intended to be limited to the type of dispersant. FIG. 5 shows a mat 501 of BNNT produced by dispersing a BNNT ball in ethyl alcohol via sonication, and pulling the alcohol with the dispersed BNNTs through 40 micron filter paper. The collected BNNT material forms a BNNT mat 501 across the filter that has 2-D alignment of the BNNT fibers. The BNNT mat 501 is easily peeled off from the filter. The BNNT mat 501 can be infused with compositing material and further stretched. For example, a liquid composite material can be spread over the BNNT mat 501, and then the covered mat can be placed in a vacuum chamber. The vacuum causes the compositing material to fully infuse or disperse into the BNNT mat 501. In some embodiments, the BNNT mat 501 can be further compressed and for some compositing materials, heat or light may be applied to the composite so as to harden the composite or enhance the bonding into the surface of a material. Lithium-ion batteries include a permeable membrane separator, typically formed from a polymeric material, between the anode and cathode. In embodiments for lithium-ion batteries the BNNT mat 501 may be compressed into the surface of the polymer separator material. The compression may take place near the polymer's melting point, thereby infusing the polymeric material into the BNNT mat, and resulting in a separator material with enhanced strength, thermal conductivity, and porosity. As one of ordinary skill should appreciate, there are a variety of techniques for making BNNT mats 501 and combining the BNNT mats 501 with compositing materials.

Figure 6:
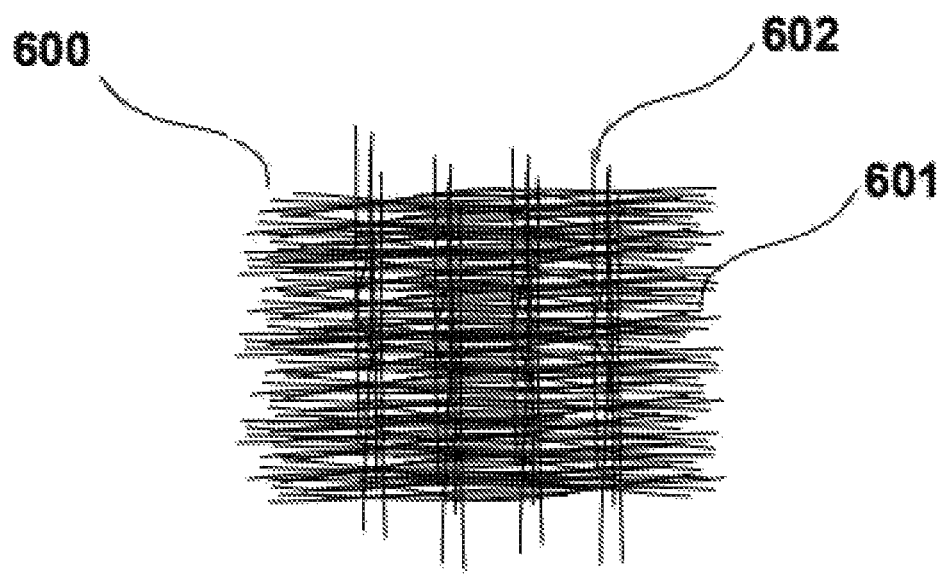
FIG. 6 illustrates BNNT yarns/strings woven into a BNNT mat.

FIG. 6 illustrates an example of 1-D or linearly-aligned BNNT yarns 601 and 602 woven into a 2-D fabric 600. A variety of weaving technologies may be utilized as have been around for millennia. For example, a compositing material may be added to the BNNT strands forming the BNNT yarns 601 and 602 that are being woven into the fabric 600. In some embodiments either chemical or heating processes may subsequently remove the compositing material the same way wool is often washed after weaving. Further, similar to the manner in which wool may be died before weaving, some embodiments the BNNT yarns 601 and 602 may be chemically processed and functionalized with the addition of other chemicals prior to or after the weaving process. The 2-D fabric 600 can have structure, in terms of BNNT spacing and density, to match the layout of EC components. For example, certain EC layouts have regularized spacing between components and the 2-D fabric 600 can be woven to match this spacing.

Additional processes for achieving desired BNNT alignment can involve making composites of BNNT and materials such as polymers, and then stretching the polymer composite in 1-D or 2-D arrangements. For example, a bulk composite of BNNT and a heated compositing material can be extruded via a small orifice to make a composite fiber that as it cools following passing through the orifice turns into a solid material with the BNNTs aligned along the axis of the fiber. In another embodiment, BNNTs may be dispersed in a liquid or gas flowing through a channel, such that the shear forces improve BNNT alignment in the flow direction. In some embodiments the BNNTs may be aligned, then the compositing material is infused with the BNNTs and subsequently, the composite may be stretched and/or flattened to further enhance the alignment. It should be appreciated that the degree of alignment may vary.

It should be appreciated that "generally parallel" includes embodiments in which the long axis for the majority of BNNTs in a BNNT group are oriented less than 90-degrees relative to the contact surface. In practice, there are variabilities in the orientation of BNNTs in a BNNT group. For example, a majority of BNNTs may be oriented at less than 90-degrees relative to the surface, a smaller fraction oriented at less than about 45-degrees relative to the surface, and an even smaller fraction oriented at less than about 15-degrees relative to the surface. Preferably, the long axis for the majority of the BNNTs is nearly parallel to the contact surface. In practice, however, BNNTs have non-linear portions, and thus this specification references "generally parallel" to account for non-linear portions as well as the variability of BNNTs within a BNNT group.

Figure 7A:
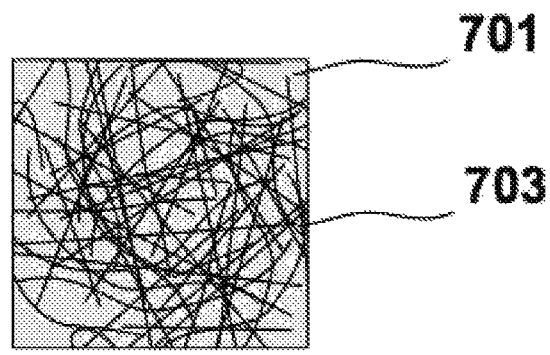
FIGS. 7A-7C illustrate BNNT fibers, yarns/strings and weaves composited with compositing materials.
Figure 7B:
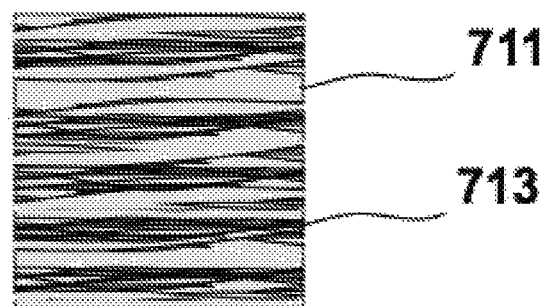
Figure 7C:
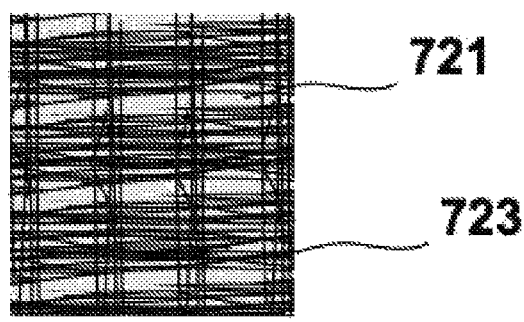

FIGS. 7A-7C illustrate sections of BNNT materials infused with a compositing material viewed from above. FIG. 7A illustrates a 2-D BNNT mat 701 infused with a compositing material 703. FIG. 7B illustrates 1-D or linearly-aligned BNNTs 711 infused with a compositing material 713 to achieve directional heat transport generally in the alignment direction, and structural enhancement. FIG. 7C illustrates a BNNT woven fabric 721 infused with a compositing material 723 to provide 2-D direction heat transport, structural enhancements, and dielectric grid. As one of ordinary skill should appreciate from the foregoing, there are a variety of techniques that can be utilized to achieve alignment of BNNT fibers in a variety of materials.

In general, ECs typically have layers of materials in a variety of geometries, including flat sheets and rolls, and often perforated with a variety of interconnections. ECs include one or more layers of components and in turn each layer may have sublayers of components, such as semiconductors, dielectrics, electrically insulating or conductive materials, glues, thermal transport layers, heat sinks, etc. EC layers and sublayers may include materials such as: carbon nanotubes, graphene, Ge, Si, $SiO_2$, $Al_2O_3$, InGaN, InGaAs, AlGaN, GaN, SiO, sapphire, other oxides and semiconductors, aluminum, copper, gold, organics and others. Frequently, one or more layers, or portions thereof, may be doped. Aligned BNNTs may be composited with any of these materials. Depending on the material, one or more techniques may be used to hold the BNNTs in the desired position. These include, for example, cooling a melt, hardening polymers including epoxies via heat or light, and mechanical elements.

Figure 8:
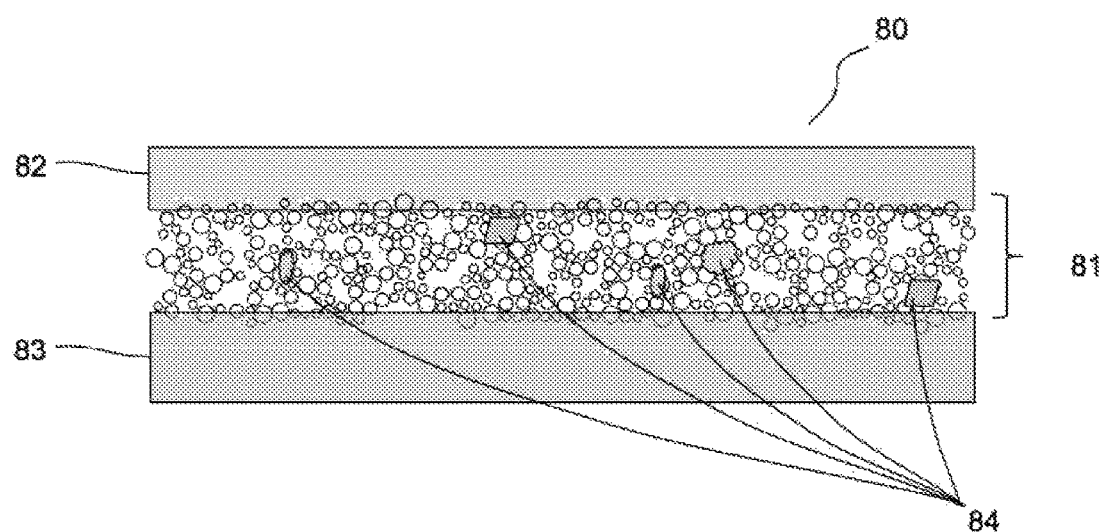
FIG. 8 illustrates and end view of in-plane aligned BNNTs between two layers or sublayers of an EC.

BNNTs may be advantageously incorporated in one or more EC layers for thermal management, among other beneficial enhancements. FIG. 8 illustrates an end view (or cross-section) of a simple EC layer 80. Layer 80 includes aligned BNNTs 81 between a top layer 82 and a bottom layer 83. BNNT layer 81 includes impurities 84, which may result from the particular manufacturing process used to form the BNNT layer 81. Although not illustrated in FIG. 8, BNNT layer 81 may include a compositing material. The embodiment illustrated in this drawing has enhanced heat transport out of the page in the in-plane direction, as that is the direction of the alignment of the BNNTs. In addition, there is enhanced heat transport out-of-plane as the BNNT fiber-to-fiber, i.e. nanotube-to-nanotube, contact transports heat with enhanced efficiency in that direction though not to the extent as the heat transport in the direction of alignment.

Figure 9:
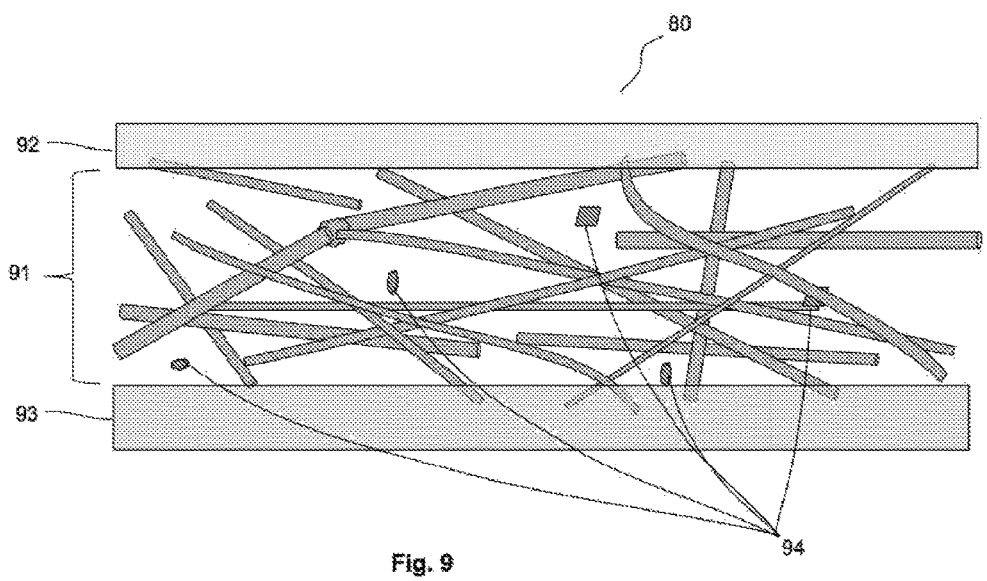
FIG. 9 illustrates a side view of in-plane aligned BNNTs between two layers or sublayers of an EC.

FIG. 9 illustrates a side view of the same EC layer 80 illustrated in FIG. 8. When viewed from the side, EC layer 80 includes BNNT layer 91, linearly aligned from left to right, with impurities 94 resulting from the manufacturing process. The degree of alignment illustrated in this drawing is somewhat low, as there are some BNNTs nearly vertical. It should be appreciated that the degree of alignment may vary depending on the manufacturing and processing used in a particular embodiment. Generally, however, the BNNTs in a group are preferably aligned such that the long axis of each nanotube is oriented in the same general direction. Because BNNTs produced by most manufacturing processes are not perfectly linear structures, but instead as shown in FIG. 4 include various twists, bends, and non-linear lengths, it should be understood that FIG. 9 approximates each BNNT as a cylinder, and shows the general orientation of each cylinder as sloping in a direction generally parallel with the contact surface of layers 92 and 93. The BNNT layer 91 is positioned between the top layer 92 and bottom layer 93. In this embodiment, the BNNT layer 91 is slightly embedded in the two adjacent layers 92 and 93, such that a portion of some BNNTs penetrates a layer. In this example, embedding is not uniform, as may be the situation depending on the materials used for layers 92 and 93. Although not illustrated in FIG. 9, a compositing material such as ceramics, metals and polymers may be included with the BNNT layer 91. It should be appreciated that a compositing material may be included in each embodiment, even though not illustrated in a drawing or explicitly referenced in this description.

Figures 10A, 10B, 10C:
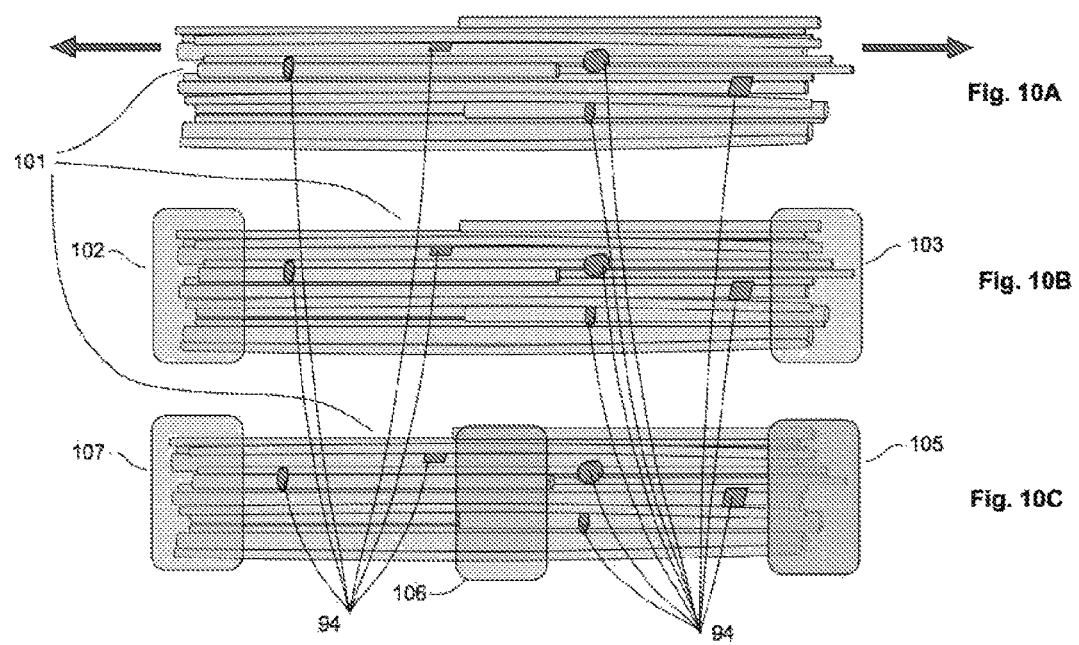
FIGS. 10A-10C illustrate BNNT bundles with composite interconnects or heat sinks for making connections to layers or sublayers of ECs.

In some embodiments, a BNNT group layer may feature one or more site-specific infused compositing materials. A site-specific infusion refers to an infusion present at only a portion of the BNNT group layer, such as infusions at separate locations along a length of a BNNT bundle. FIGS. 10A-10C illustrate examples of aligned BNNTs with site-specific infused compositing materials. FIG. 10A illustrates linearly-aligned BNNTs 101 with a few impurities 104. The arrows show the direction of heat transfer. FIG. 10B illustrates the aligned BNNTs 101 infused with separate compositing materials 102 and 103 at separate locations. Compositing materials 102 and 103 may be useful for interconnecting the aligned BNNTs to other components or layers in an EC. For example, solders, droplets of compositing material, etc. may be injected or deposited at appropriate locations in the EC. FIG. 10C illustrates three different compositing materials 105, 106, and 107 infused with the aligned BNNTs 101 at separate locations. As one of ordinary skill will appreciate, great flexibility is achievable in terms of the geometries and materials utilized. Compositing materials may be electrically insulating, electrically conducting, or semiconductor materials, depending on the need for the compositing material at the particular site. Due their stability at high temperature, the BNNTs will work with dissimilar materials, e.g. one portion of an EC can be a ceramic and another portion may be a metal, a different ceramic, a polymer, a metal, or a repeat of any of the former.

Processes for fabricating ECs having BNNT layers include: laser driven sintering of ceramics, laser driven melting of metals, and forming the BNNT layout of felts, yarns and/or fabrics with polymers, then oxidizing away the polymer and dispersing the ceramic(s) and/or metal(s) into the BNNTs, and then heating to lock in the dispersed ceramics(s) and/or metal(s). As one of ordinary skill in the fabrication will appreciate, there is an extremely diverse set of technologies that are utilized to fabricate EC and the methods vary layer by layer and sublayer by sublayer as the materials properties of the specific layer or sublayer. The technique for incorporation of the BNNTs into the specific layer or sublayer must be specific to the particular material forming the layer or sublayer.

Heat transport in ECs may be enhanced by BNNT bundles, yarns and/or strings, transporting heat between the layers and in multilayer structures. The term BNNT "bundle" refers to a plurality of BNNT groups, strings, or yarns, forming a single mass of BNNTs. In some instances, the heat transfer may be enhanced by the presence of compositing material in contact with the BNNTs and, in some embodiments, the EC layer or sublayer. For example, the BNNTs may be composited with ceramics, metals, polymers, epoxy, thermal grease, or other material infused by CVD, plasma, electron beam, ion beam processes, etc. in geometries such that the BNNTs have thermal connection to the EC layers. The material used for the connection to one layer may be different from the material used for connection to other layers of the EC. The BNNTs, or a portion thereof, may be electrically insulated from one or more layers to take advantage of their dielectric or non-electrical conductivity properties. BNNTs may be composited with an electrical conductor to provide both heat transport and electrical conductivity. Small particles of amorphous BN, h-BN, and boron may also be present and in most embodiments the performance is enhanced if the amount of these small particles is minimized.

Heat predominantly propagates along the long axis of aligned BNNTs 101 illustrated in FIG. 10A and is released to the environment near the ends of the bundle of aligned BNNTs 101. The exterior ends of the sublayer bundle of BNNTs 101 illustrated in FIG. 10A are open to the surrounding environment that would typically be air, but could be other mediums or materials. The exterior ends of the sublayer bundle of BNNTs 101 in FIG. 10B are embedded in compositing materials 102 and 103, which may be heat sinks comprised of, for example, aluminum, gold, pyrolytic graphite, and/or thermally conductive epoxy, etc. The exterior ends of the bundle of BNNTs 101 in FIG. 10C are embedded in compositing materials 105 and 107, that could be, for example, heat sinks or connectors comprised of aluminum, copper, gold, pyrolytic graphite, and/or thermally conductive epoxy, etc. It should be appreciated that the compositing materials 105 and 107 may be formed of similar or dissimilar materials, depending on the embodiment. Further, there may be an intermediate compositing material 106 that could be another heat sink or connector, comprised of, for example, any one of the aforementioned materials. As one of ordinary skill should appreciate, this sequence of heat sinks of similar or dissimilar materials may be repeated along the bundle of BNNTs 101 any number of times.

Figure 11:
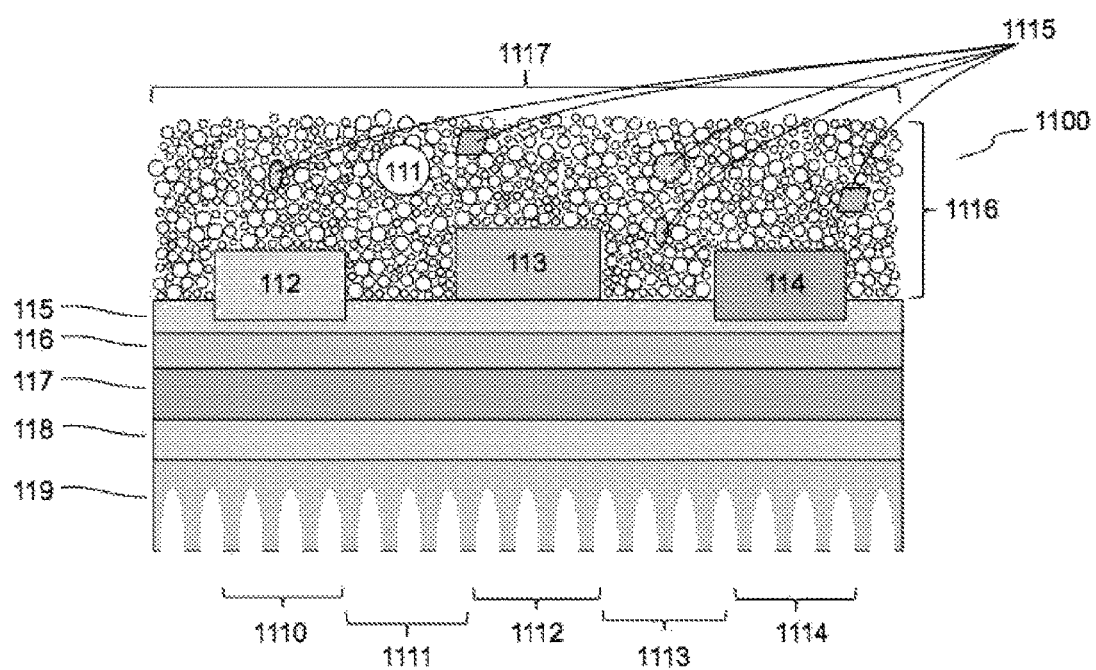
FIG. 11 illustrates a transistor with the aligned BNNTs across the topside.

As an example embodiment, FIG. 11 illustrates a transistor 1100 with a source 112, gate 113 and drain 114. These three subcomponents may be placed on or be embedded within a number of sublayers of insulating, semiconductive, and conductive materials 115-118 and there may be a heat sink subcomponent 119. The configuration illustrated in FIG. 11 is merely demonstrative, and additional or fewer sublayers may be present depending on the particular device. The gate 113 may be eliminated to create a diode. In the case of an LED, a layer of transparent material may cover the source 112 and drain 114. Note, BNNTs are optically transparent to IR and visible light, and thus would not impede an LED. Many of the subcomponents, including the source 112, gate 113, drain 114, and sublayers 115-118, may typically be only a few nm to a few tens of nm in thickness, but may extend beyond these ranges depending on the particular EC. Thickness of sublayers close to the source, gate and drain are typically a few nm to a few tens of nm, but may extend beyond this range including up to mm or more, for PCB, PWB and heat sink sublayers (if present). Additional sublayers may be present compared to what is illustrated in FIG. 11. The source 112, gate 113, and drain 114 may or may not have simple shapes and may or may not be embedded in the top sublayer(s). The spacing 1110-1114 between the source 112, gate 113 and drain 114, are typically in the range of 0.1 to 5 microns, but in some embodiments may extend beyond this range or be below this range, especially for multilayer ECs, including, for example, integrated circuits (ICs). Some ECs may have other subcomponents, such as resistors, capacitors, etc.

The BNNTs 111 illustrated in FIG. 11 are illustrated as a top-side sublayer but could be on other surfaces such as the bottom-side. Having mostly small diameters of only 1.5-6 nm, the BNNTs 111 can closely contact or interface with the source 112, gate 113, drain 114, and nearby materials, and transport heat away from the critical areas where the source 112, gate 113, and drain 114 make a junction with the sublayer(s) they are in contact with, thereby lowering the junction temperature(s) for a given level of current flowing through the device. The BNNTs 111 are also in close contact with each other, thereby providing the paths for phonons to flow from one BNNT to other BNNTs. The phonon flow may also occur via a coating, compositing or connecting material such as an epoxy, thermal grease, local gas, etc. FIG. 11 is a cross section view in the plane perpendicular to the direction of the aligned BNNTs 111 so the heat is being transported out of the plane of the figure. In addition to the BNNTs 111 illustrated are boron, amorphous BN or h-BN particles 1115. To enhance performance, these particles are minimized both for the number of particles and their size.

The aggregate width 1117 of the sublayer bundle of BNNTs 111 may vary from some 10s of nm to 100s of microns or even 10s of mm depending on the device. The width 1117 is dependent on the widths and spacing of the source, gate (if present), drain, resistors, capacitors, etc., and the width 1117 is dependent on the amount of heat generation from the EC expected to be transported. The height or thickness 1116 of the sublayer bundle of BNNTs 111 is dependent on the feature size of the subcomponents, the amount of compositing or coating material (if present), the distance to other adjacent layers and sublayers, and the amount of heat to be transported.

Figure 12:
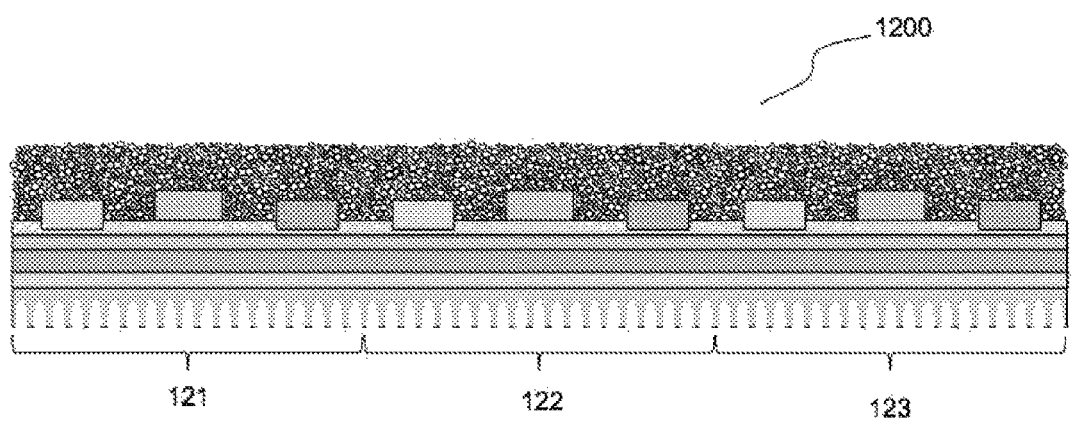
FIG. 12 illustrates multiple transistors with aligned BNNTs across their topsides.

FIG. 12 illustrates an EC 1200 having three transistors 121, 122 and 123 fabricated on the same layers. Clearly any number can be put on a given layer, e.g. 2, 3, 4, . . . , millions or even billions in the case of some ICs. In addition, the subcomponents illustrated as transistors could instead be diodes, LEDs, resistors, capacitors, etc., depending on the EC. In all cases the BNNTs 111 as illustrated in FIG. 11 along with any coatings or compositing materials, may be placed across the multiple subcomponents to enhance transport of heat in the direction into or out of the page.

Figure 13:
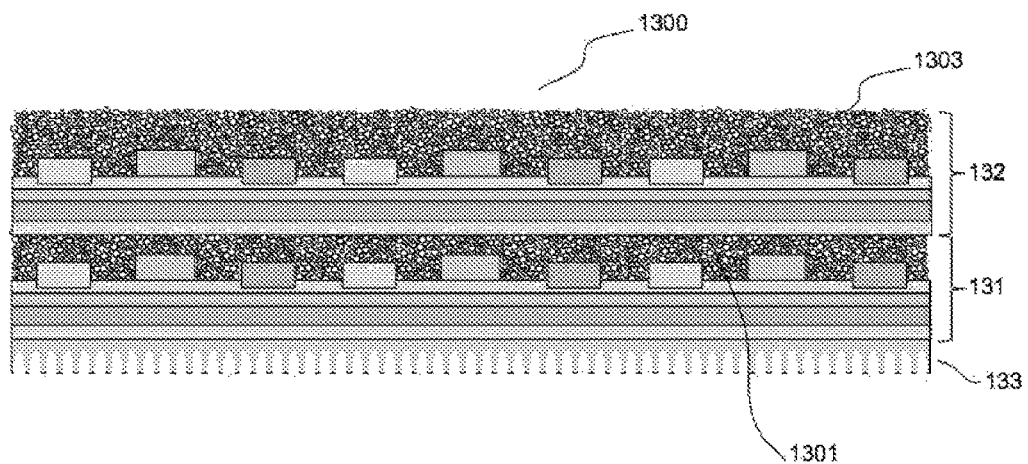
FIG. 13 illustrates multi-layered transistors with aligned BNNTs across the topsides and, for the lower layer, the bottom side.

FIG. 13 illustrates an EC 1300 with two layers 131 and 132 similar to the layer illustrated in FIG. 12, forming a multilayer IC. A single heat sink 133 is included in this embodiment. The layer of BNNTs 1301 forms a back-side layer to the upper layer 132, while being a top-side layer for the lower layer 131. Interlayer connects and subcomponents such as capacitors are not illustrated, but as one of ordinary skill in the art should appreciate, a number of interconnects, sublayers, and subcomponents may make up the multilayer IC 1300. The bundles BNNTs 111 illustrated in detail in FIG. 11 and BNNT layers illustrated in FIGS. 12 and 13 are providing enhanced heat transport for the EC, as well as material structural enhancements, and thereby improving performances of the ECs. In addition, the BNNTs bundles provide modified dielectric constants, in particular lower dielectric constants due to the porosity of the BNNTs, which for ECs and ICs operating with varying electrical flows will reduce the component heating in most applications.

Figure 14:
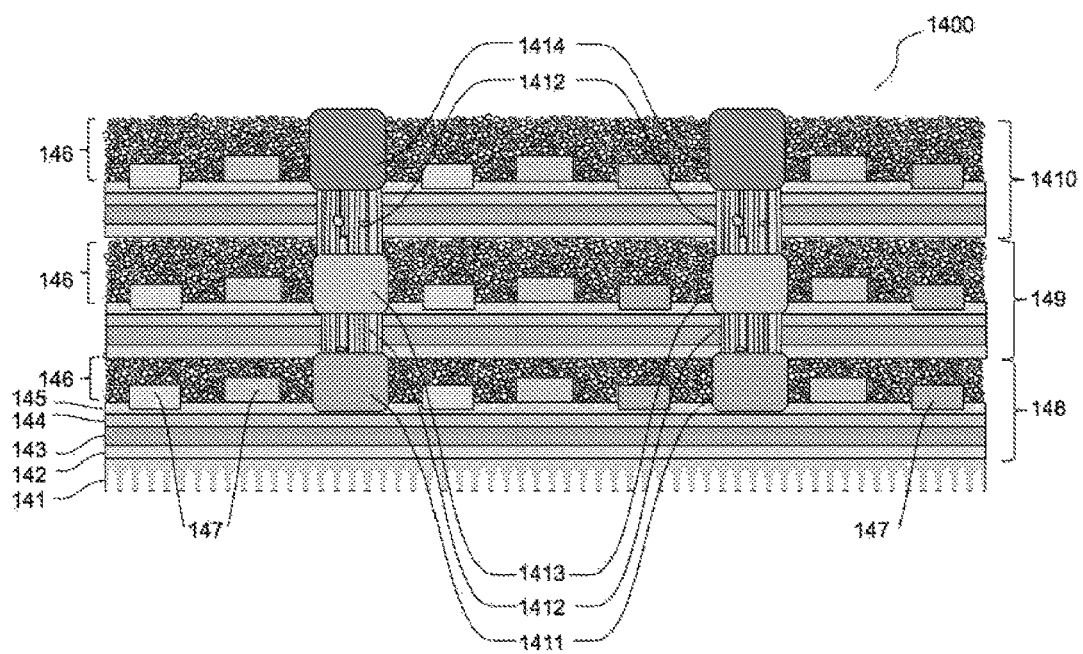
FIG. 14 illustrates multi-layered transistors with aligned BNNTs across their topsides and for the intermediate and lower layers their bottom side with the addition of aligned BNNTs transporting heat across the multiple layers of transistors.

FIG. 14 illustrates an embodiment of an EC 1400 with three primary layers 148, 149 and 1410 EC. Each primary layer in this embodiment includes multiple sublayers 142-146 for illustrative purposes, and multiple components 147. A single heat sink 141 is illustrated, though in practice there may be other heat sinks, such as top-side heat sinks. The BNNT layers 146 provide thermal conductivity and low dielectric properties in a direction into and out of the drawing. The dielectric properties may be manipulated by controlling the level of alignment of the BNNTs going into the BNNT layers.

Inter-layer and sublayer BNNT interconnects 1412 and layer and sublayer connections 1411, 1413, and 1414, provide thermal transport that can be either electrically insulating with associated dielectric properties, or electrically conductive or semiconductive. In some embodiments, different sublayers may have different properties, e.g., one sublayer may be electrically insulating and another sublayer may be electrically conductive. The BNNT interconnect 1412 and sublayer connections 1411, 1413, and 1414, may be, for example, a BNNT bundle cut to precisely fit the application. For example, the BNNT bundles can be prepared as a string or yarn with the various compositing materials interspersed periodically along the BNNT bundle for interconnecting to the inter-layer connection points, and the BNNT string or yarn can be threaded through the interconnect locations. The selection of ceramic, metal, and/or polymer material utilized to composite or coat the BNNTs and/or portions thereof, may be used to control the properties of sublayers. For example, portions of the BNNTs in a first sublayer may be composited or coated with a ceramic, and portions of the BNNTs in a second sublayer may be composited or coated with a polymer material. In this way the thermal connection to a given layer can be enhanced by optimizing the compositing or coating material for the thermal connection to the materials in the given sublayer or layer.

Interlayer connects and subcomponents such as metal conductors, capacitors and interconnects for connecting the EC to other components are not illustrated, but as one of ordinary skill in the art of ICs and multilayer ICs should appreciate, a very diverse number of interconnects, sublayers and subcomponents may make up a multilayer IC.

Figure 15:
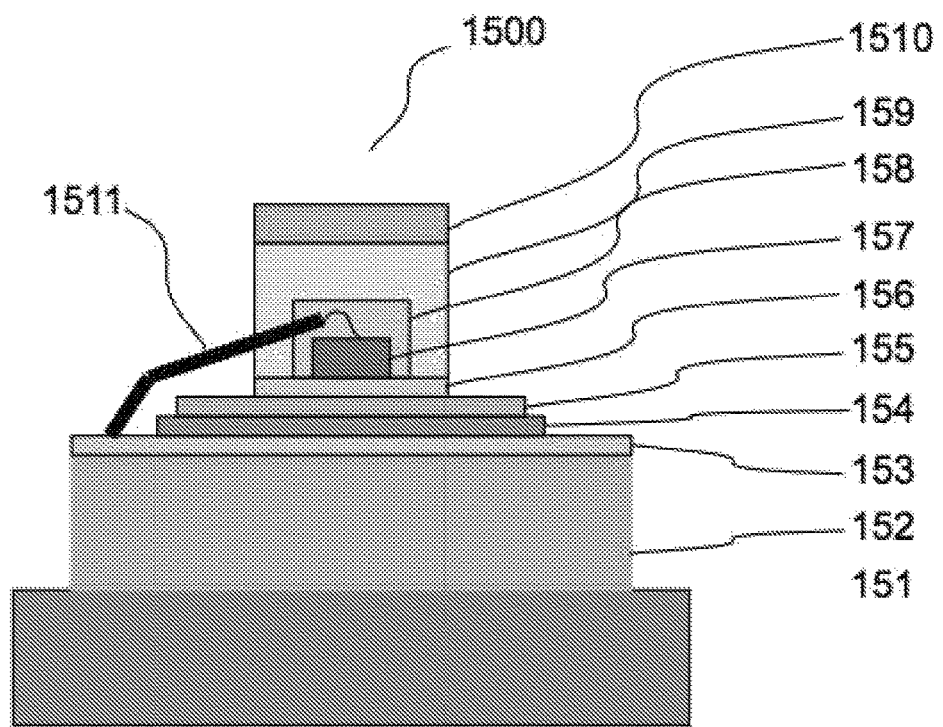
FIG. 15 illustrates a light emitting diode where BNNTs can be utilized to lower its junction temperature.

Diodes, including light-emitting diodes, represent another category of ECs that may benefit through the incorporation of BNNTs. FIG. 15 illustrates a light emitting diode 1500 that includes the following layers and components: heat sink 151, baseplate 152, interface 153, solder 154, transition heat sink 155, attach layer 156, emitter or LED emitter 157, phosphor 158, resin-glue 159, lens 1510 and/or electrode 1511. These layers and components are meant to be illustrative of common light-emitting diodes, and embodiments may vary. In select embodiments, BNNTs can be included in any layer that can be made of compositing materials compatible with being composited with BNNTs to include the heat sink 151, solder 154 resin-glue 159 and lens 1510. For example, including BNNTs in resin-glue layer 159 allows for lowering the critical junction temperature of the emitter or LED emitter 157. Further, the BNNT increases the porosity and thereby lowers the dielectric value of the resin-glue layer 159, providing lower heat going into the attach layer 156 junction.

Generally, the geometry of the BNNTs used for multilayer interconnects may vary greatly in cross sectional area and length. The BNNTs themselves are typically in the 1.5 to 6 nm diameter and their lengths can vary from 10s of nm to 100s of microns. Consequently a great range of possibilities for assembling small to very large numbers of BNNTs to form the BNNT bundles, yearn and/or strings.

FIGS. 8, 9, 10, 11, 12, 13, and 14 show the BNNT bundles to be in-plane or mostly in-plane. FIG. 14 shows some BNNT bundles that are out-of-plane with reference to the three layers illustrated and their sublayers. In all instances, the preferred heat transport is in the direction of the aligned BNNTs. However, the close contact of the BNNTs creates BNNT tube-to-tube or fiber-to-fiber contacts that also enhance the heat conductivity across the BNNT fibers. So while the primary heat path is along the length of the BNNTs, there is also enhanced heat removal across the BNNT fibers. The result is that careful management of the BNNT alignment enhances the heat management in the ECs far beyond just putting BNNTs into the bulk materials as proposed by Raman or just putting BNNTs out-of-plane in limited locations as proposed by Arik.

BNNTs provide the designer and fabricator of ECs great flexibility in engineering effective heat transport and electrical properties into ECs. The BNNT layer transports heat from the hottest regions to cooler regions where the heat can be dissipated from the EC.

Heat transport in ECs may be enhanced by BNNT tube contact with the top-side and bottom-side materials in addition to being composited into materials making up the layers and multilayer structures. In some instances the heat contact may be enhanced by the presence of compositing material in contact with the BNNTs and the EC subcomponents. For example, the BNNTs may be uncoated or coated with thin amounts of epoxy, thermal grease, or other material infused by CVD, plasma, electron beam, ion beam processes, etc. Small particles of amorphous BN, h-BN, and boron may also be present. Clamps or glues may be used to assist in keeping the BNNTs in contact with the top-side, bottom-side, etc. components.

As one of ordinary skill should appreciate, the embodiment described herein range from nanometers to centimeters in a single figure, i.e. seven orders of magnitude in scale. Many of the beneficial effects generally occur due to the few nm diameter of the typical BNNT coming in close contact with the few nm to micron scale structures of the ECs and transporting the heat to heat sinks, plus the ability of high quality BNNTs to transport heat from BNNT to BNNT thereby greatly spreading and transporting the heat over much longer distances and much larger areas. BNNTs provide the designer and fabricator of ECs and ICs great flexibility in engineering effective heat transport into ECs. The BNNT transport heat from the hottest regions to cooler regions where the heat can be dissipated. The BNNTs being electrical insulators provide minimal interference with the electrically conductive materials in the ECs while offering the designer a new tool for the introduction of porosity at the nm and micron scales the optimize the dielectric properties such as achieving low-k for lower electrical loss and consequently lower heating, while at the same time the BNNTs' strength provides structural enhancements valuable for high temperature operation and thermal cycling of the ECs.

In all the above processes there may be some amounts of particles of amorphous boron, amorphous boron nitride (BN) and/or hexagonal-boron nitride (h-BN) (sometimes referred to as BN platelets). Depending on the chemical character of the layer a purification step may be utilized to remove these particles to achieve enhanced thermal conductivity performance. In some cases these particles may contribute to the enhanced thermal conductivity. The ECs will also be more resilient to external forces by the addition of BNNT due to its exceptional strength. The BNNT based composites will better withstand large thermal variations, vibrations, accelerations, etc. thereby providing improved performance especially in extreme environments.

The terminology used herein is for the purpose of describing particular embodiments only and is not intended to be limiting of the approach. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The principles described herein may be embodied in other specific forms without departing from the spirit or essential characteristics thereof. The present embodiments are therefore to be considered in all respects as illustrative and not restrictive.

What is claimed is:

1. A method for thermal management in an electrical component, the method comprising:
    applying a BNNT group layer to a contact surface of a material layer in the electrical component,
    wherein the BNNT group layer is aligned generally parallel to the contact surface such that the BNNTs in the BNNT group layer are aligned generally parallel to the contact surface, and wherein at least a portion of the BNNTs in the BNNT group layer penetrate the contact surface, such that the BNNT group layer is embedded in the contact surface.

2. The method of claim 1, wherein the BNNT group layer is composited into the material layer.
3. The method of claim 1, wherein the BNNT group layer is linearly aligned, such that the BNNTs in the BNNT group layer are aligned generally parallel to each other.
4. The method of claim 1, wherein the BNNT group layer comprises a BNNT mat.
5. The method of claim 1, wherein the BNNT group layer comprises a BNNT bundle.
6. The method of claim 1, further comprising flattening the BNNT group layer.
7. The method of claim 1, further comprising stretching the BNNT group layer in a first direction, and wherein the BNNT group layer is applied to the contact surface such that the first direction is generally parallel to the contact surface.
8. The method of claim 1, further comprising forming the BNNT group layer by: dispersing BNNTs in a dispersant, and
    pulling the dispersed BNNTs and dispersant through a filter.
9. The method of claim 1, wherein the BNNT group layer comprises at least one compositing material.
10. The method of claim 9, wherein the at least one compositing material is at least one of a ceramic, a metal, a polymer, an epoxy, and a thermal grease.
11. The method of claim 9, wherein the BNNT group layer is infused with the at least one compositing material.
12. The method of claim 1, wherein the BNNT group layer is composited with an electrical conductor.
13. The method of claim 1, further comprising compressing the BNNT group layer into the material layer.
14. The method of claim 1, wherein the BNNT group layer comprises woven BNNT yarns.
15. The method of claim 1, wherein a first side of the BNNT group layer contacts the contact surface of the material layer, and further comprising positioning a second material layer on a second surface of the BNNT group layer.
16. The method of claim 1, further comprising forming a site-specific infusion on the BNNT group layer, such that a compositing material is infused in a portion of the BNNT group layer.
17. The method of claim 1, wherein the BNNT group layer comprises a terminal end, and the terminal end is exposed to the environment.
18. The method of claim 1, wherein the BNNT group layer comprises a terminal end, and further comprising embedding the terminal end in a compositing material.
19. The method of claim 1, wherein the contact surface includes a source and a drain.
20. The method of claim 19, wherein the BNNT group layer is in contact with the source and the drain.
21. The method of claim 1, wherein the contact surface includes a source, a gate, and a drain.
22. The method of claim 21, wherein the BNNT group layer is in contact with the source, the gate, and the drain.
23. The method of claim 22, wherein the BNNT group layer is composited into the material layer.
24. An electrical component comprising:
    a material layer having a contact surface, and
    a BNNT group layer in contact with the contact surface;
    wherein the BNNT group layer comprises BNNTs aligned generally parallel to the contact surface, such that the BNNTs in the BNNT group layer are aligned generally parallel to the contact surface, and
    wherein at least a portion of the BNNTs in the BNNT group layer penetrate the contact surface, such that the BNNT group layer is embedded in the contact surface.

25. The electrical component of claim 24, wherein the BNNTs forming the BNNT group layer are generally parallel to each other.

26. The electrical component of claim 24, wherein the contact surface includes a source and a drain.

27. The electrical component of claim 26, wherein the BNNT group layer is in contact with the source and the drain.

28. The electrical component of claim 24, wherein the contact surface includes a source, a gate, and a drain.

29. The electrical component of claim 28, wherein the BNNT group layer is in contact with the source, the gate, and the drain.

30. The electrical component of claim 24, wherein the BNNT group layer comprises at least one of a BNNT mat and a BNNT bundle.

31. The electrical component of claim 24, wherein the BNNT group layer comprises at least one compositing material.

32. The electrical component of claim 31, wherein the at least one compositing material is at least one of a ceramic, a metal, a polymer, an epoxy, and a thermal grease.

33. The electrical component of claim 31, wherein the BNNT group layer is infused with the at least one compositing material.

34. The electrical component of claim 24, wherein the BNNT group layer is composited with an electrical conductor.

35. The electrical component of claim 24, wherein the BNNT group layer is compressed into the material layer.

36. The electrical component of claim 24, wherein a first side of the BNNT group layer is in contact with the contact surface of the material layer, and further comprising a second material layer on a second surface of the BNNT group layer.

37. The electrical component of claim 24, wherein the BNNT group layer comprises a site-specific infusion, such that a compositing material is infused in a portion of the BNNT group layer.

38. The electrical component of claim 24, wherein the BNNT group layer comprises a terminal end, and the terminal end is exposed to the environment.

39. The electrical component of claim 24, wherein the BNNT group layer comprises a terminal end, and further comprising embedding the terminal end in a compositing material.

* * * * *